May 30, 1961 W. F. GUNNING 2,986,654

SINGLE TRANSISTOR SERIES GATE WITH GROUNDED CONTROL VOLTAGE

Filed April 10, 1958

INVENTOR.
WILLIAM F. GUNNING

BY HIS ATTORNEYS.
HARRIS, KIECH, FOSTER & HARRIS

United States Patent Office 2,986,654

Patented May 30, 1961

2,986,654

SINGLE TRANSISTOR SERIES GATE WITH GROUNDED CONTROL VOLTAGE

William F. Gunning, Fullerton, Calif., assignor to Beckman Instruments, Inc., a corporation of California Filed Apr. 10, 1958, Ser. No. 727,623

9 Claims. (Cl. 307—88.5)

This invention relates to transistor switching circuits and in particular to transistor switching circuits employing single-transistor switches.

It is an object of this invention to provide a transistor switch for connecting an input voltage to an output line or device which requires only a single transistor. A further object of the invention is to provide such a transistor switch in which the control voltage which turns the transistor on and off or changes it from the conducting to the nonconducting conditions, does not have to be floating and may be connected to circuit ground.

It is a further object of the invention to provide a transistor switch which is bipolar, i.e., one which will operate with input signals which are either positive or negative with respect to circuit ground. Another object of the invention is to provide such a transistor switch for use with grounded control voltages and having a control current balance circuit so that the control currents do not affect the signal source.

It is another object of the invention to provide a switching circuit using single-transistor switches for connecting one of a plurality of inputs to an output. A further object of the invention is to provide such a switching circuit in which the output voltage is coupled back into the switching circuit through a unity gain amplifier and single-transistor switches in order to compensate for the nonideal characteristics of transistor switches.

The invention also comprises novel details of construction and novel combinations and arrangements of parts, which will more fully appear in the course of the following description. The drawing merely shows and the description merely describes preferred embodiments of the present invention which are given by way of illustration or example.

Figures 1, 2, 3:
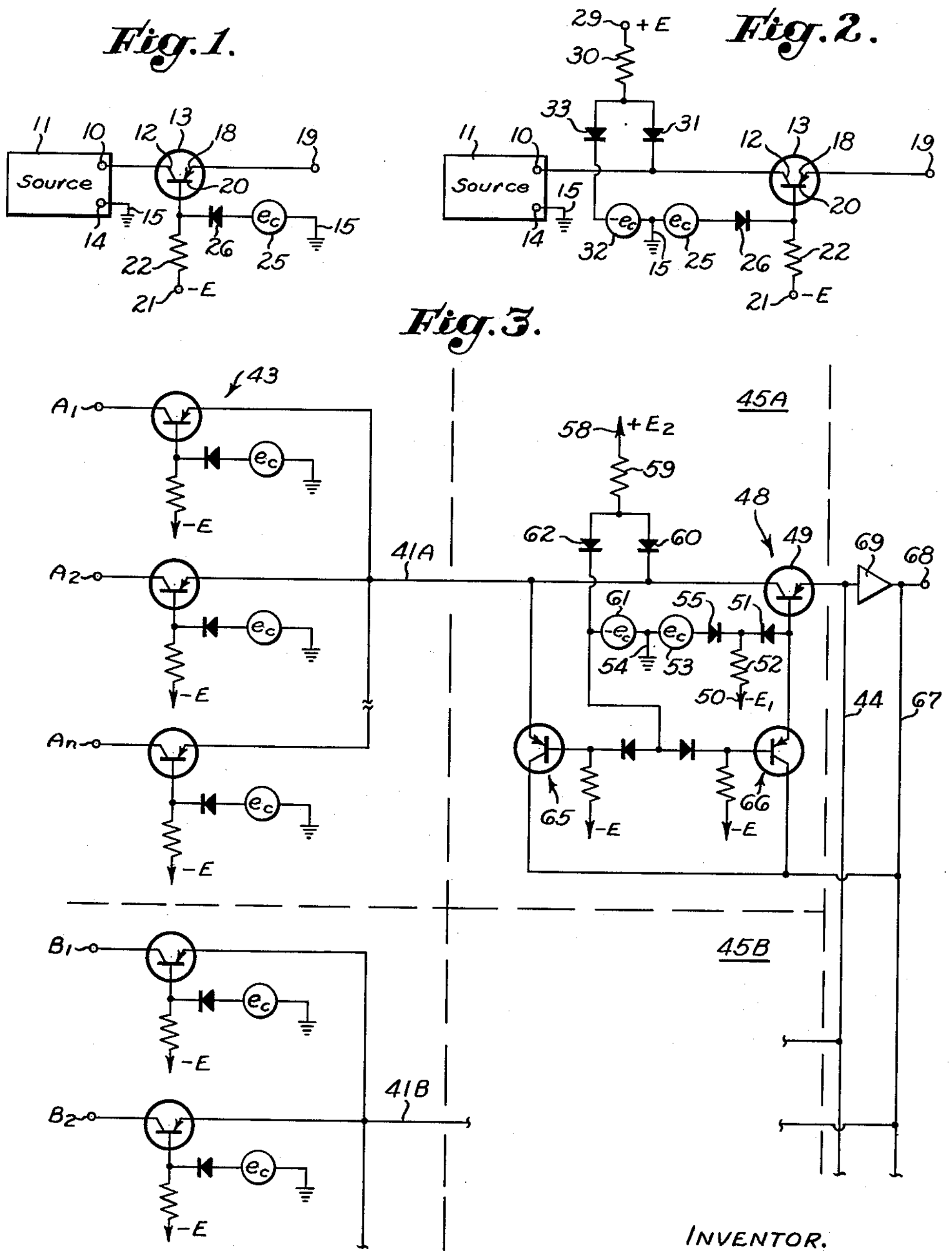
Fig. 1 is a schematic diagram of a preferred embodiment of a transistor switch.
Fig. 2 is a schematic diagram of an alternative embodiment of a transistor switch.
Fig. 3 is a schematic diagram of a switching circuit utilizing the transistor switches of the invention.

A pnp junction transistor is shown in the transistor switch of Fig. 1; however, it should be understood that other types of transistors can be used in the circuits of the invention, it merely being necessary to select the proper polarity and magnitudes depending upon the characteristics of the particular transistor selected.

One terminal 10 of an input signal source 11 is connected to the collector 12 of a transistor 13 with the other terminal 14 of the source connected to circuit ground 15. The emitter 18 of the transistor is connected to an output terminal 19 and the base 20 of the transistor is connected to a negative voltage source 21 through a resistance 22. A control voltage 25 is coupled to the base 20 through a rectifier 26 which is polarized to permit current conduction from the control voltage 25 to the base 20, i.e., the anode element of the rectifier is coupled to the control voltage and the cathode element is coupled to the base. The control voltage 25 may be operated from circuit ground 15 or from any other fixed reference point and is made positive to change the transistor to the off or nonconducting condition and is made negative to change the transistor to the on or conducting condition. The magnitudes of the resistance 22, the negative voltage 21 and the control voltage 25 are not critical, but are dependent upon the characteristics of the transistor and the rectifier and are selected so that the rectifier is conducting for the off condition and is not conducting for the on condition.

The connections to the emitter and collector of the transistor may be reversed without affecting the operation of the switch; however, the connections shown in Fig. 1 provide the best performance with present day transistors.

With the circuit of Fig. 1, input signals of either polarity relative to circuit ground will be coupled to the output terminal 19 when the switch is in the on or conducting condition, thus providing a bipolar single-transistor switch.

In the switch of Fig. 1, the control current, which is approximately equal to the magnitude of the negative voltage 21 divided by the magnitude of the resistance 22, will flow through the source. This current may be objectionable in certain applications of the switch and an alternative form of the switch of the invention is shown in Fig. 2 in which the control current is balanced and does not affect the source. Identical components of the circuits of Figs. 1 and 2 are indicated by the same reference numerals. A positive voltage source 29 is connected to the input terminal 10 and collector 12 through a resistance 30 and a rectifier 31, the rectifier being polarized to permit conduction from the resistance 30 to the input terminal and collector. A control voltage 32 is connected between circuit ground 15 and the junction of the resistance 30 and rectifier 31 through a rectifier 33, the rectifier 33 being polarized to permit conduction from the resistance to circuit ground.

The control voltage 32 is given the opposite polarity to the control voltage 25 so that when the control voltage 25 goes positive for turning the switch off, the control voltage 32 goes negative and when the control voltage 25 goes negative for turning the switch on, the control voltage 32 goes positive. The magnitudes of the positive voltage 29 and resistance 30 and the negative voltage 21 and resistance 22 are selected so that the control currents in the respective resistors will substantially be the same, thereby balancing out the control currents from the input signal source.

An application of the switches of the invention to a switching circuit for connecting one of a plurality of inputs to an output is shown in Fig. 3. This type of switching circuit is described in detail in the application of Noel B. Braymer, Serial No. 727,667, filed April 10, 1958, now abandoned; and in a continuation-in-part thereof, entitled "Multiple Switching Circuit," Serial No. 799,-991, filed March 17, 1959, and assigned to the same assignee as this invention. Each of a plurality of input terminals A1, A2, . . ., An, B1, B2, . . . is coupled to intermediate lines 41A, 41B, . . . through a single-transistor switch 43, such as the switch of Fig. 1, the input terminals being divided into groups indicated by the letters, A, B, . . . with each group of terminals connected to the same intermediate line. Each intermediate line is coupled to an output line 44 by a switching circuit 45A, 45B, . . ., all of which are identical, with the circuit 45A being shown in detail.

The switching circuit 45A includes a transistor switch 48 which is similar to the switch of Fig. 2 and includes a transistor 49 with its collector connected to the intermediate line 41A, its emitter connected to ouput line 44 and its base connected to a negative voltage source 50 through a rectifier 51 and a resistance 52, the rectifier being polarized for current conduction from the base to the resistance. A control voltage 53 is connected between circuit ground 54 and the junction of the rectifier 51 and resistance 52 through a rectifier 55, the rectifier 55 being polarized for current conduction from circuit ground to the resistance. The switch 48 also includes a positive voltage source 58 connected to the intermediate line 41A through a resistance 59 and a rectifier 60, and a control voltage 61 connected between circuit ground 54 and the resistance 59 through a rectifier 62 with the rectifiers polarized as in the switch of Fig. 2.

The switching circuit 45A also includes two switches 65, 66 for coupling a common line 67 to the intermediate line 41A and the base of the transistor 49 respectively, each of the switches 65, 66 being similar to the switch of Fig. 1 with the control voltage 61 serving as the control voltage for both switches as well as for the switch 48. The common line 67 is coupled to a reference point which, in the preferred embodiment of the invention shown in Fig. 3, is the output terminal 68 of a unity gain amplifier 69 having the output line 44 as an input.

In describing the operation of the circuit of Fig. 3, the letters A, B, . . . will designate the particular switching circuit 45A, 45B, . . . with which a particular component is associated. Suppose it is desired to connect the signal appearing at the input terminal A2 to the output line 44 and output terminal 68. A negative control voltage is applied to the switch 43 for coupling the terminal A2 to the intermediate line 41A and positive control voltages are applied to all of the remaining of the switches 43 to change them to the off or nonconducting condition. A negative control voltage is applied at 53A to change the switch 48A to the conducting condition and a positive control voltage is applied at 61A to provide the balance currents for the switch 48A and also to change the switches 65A, 66A to the nonconducting condition. In the remaining of the switching circuits 45B, . . ., the switches 48 are changed to the off condition and the switches 65 and 66 are changed to the on condition.

If the switches 43 and 48 were ideal switches, the signal at the lines 44 and 67 would be substantially identical to that at the input terminal A2 while the presence or absence of signals at other input terminals would have no effect on the output of the circuit. While the transistor switches do not function as ideal switches, the circuit can be compensated so that the output is substantially identical to the selected input signal. This compensation is accomplished in part by having two switches 43, 48 connected in series between each input and the output and by having another switch 65 connected between each intermediate line 41 and the reference line 67 with the reference line switch being on when the corresponding series switches are off. When the reference line 67 is connected to the output of the unity gain amplifier 69, the emitters and collectors of the switches 48 which are in the off condition are at substantially the same potential. The decoupling effect of the circuit is improved by utilizing a second switch 66 connected between the reference line 67 and the base of the transistor of the switch 48, thus bringing all three elements of the switch 48 to the same potential.

When a transistor which is being operated as a switch is in the on or conducting condition, there is a voltage difference between the emitter and collector which is referred to as the offset voltage. The magnitude of this voltage is relatively small in present day transistors and is different for different types of transistors. The offset voltage also varies slightly in transistors of the same type.

The effect of the offset voltages is compensated for in the circuit of Fig. 3 by operating the switch 48 with either unequal resistances 59 and 52 or unequal voltages 58 and 50, or both, to provide a predetermined unbalanced control current. This is in contrast to the switch of Fig. 2 wherein the resistances and voltages were selected to give a balanced control current. The magnitude of the positive voltage 58 is made greater than that of the negative voltage 50 so that the resulting unbalanced control current will flow through the resistance of the particular transistor switch 43 which is conducting. The error voltage produced by this unbalanced current is made equal in magnitude and opposite in polarity to the sum of the offset voltage of the switch 48 plus the average of the offset voltages of the switches 43 which are coupled to the particular switch 48. Since the offset voltages of transistors of the same type which are operated in the same manner are nearly equal, this compensation circuit provides nearly exact compensation for the effects of the transistor offset voltages.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In a switch for connecting an input signal to an output device, the combination of: a transistor having a base, a collector element and an emitter element; a negative voltage source; a positive voltage source; a first resistance connected between said base and said negative voltage source; a first rectifier having its cathode element connected to said base; a second resistance connected between said positive voltage source and a junction point; second and third rectifiers having their anode elements connected to said junction point; means for connecting the input signal to one of said elements of said transistor and to the cathode element of said second rectifier; means for connecting the other of said elements of said transistor to the output device; means for applying a first variable control voltage to the anode element of said first rectifier; and means for applying a second variable control voltage to the cathode element of said third rectifier, the polarities of said first and second control voltages varying in the opposite sense for changing said switch from on to off and return.

2. In a switch for connecting an input signal to an output device, the combination of: a transistor having a base, a collector element and an emitter element; a negative voltage source; a positive voltage source; a first resistance connected between said base and said negative voltage source; a first rectifier having its cathode element connected to said base; a second resistance connected between said positive voltage source and a junction point; second and third rectifiers having their anode elements connected to said junction point; means for connecting one side of the input signal to one of said elements of said transistor and to the cathode element of said second rectifier, the other side of the input signal being circuit ground; means for connecting the other of said elements of said transistor to the output device; means for applying a first control voltage between the anode element of said first rectifier and circuit ground; and means for applying a second control voltage between the cathode element of said third rectifier and circuit ground.

3. In a switch for connecting an input signal to an output device, the combination of: a transistor having a base, a collector element and an emitter element; a negative voltage source; a positive voltage source; a first resistance connected between said base and said negative voltage source; a first rectifier having its cathode element connected to said base; a second resistance connected between said positive voltage source and a junction point; second and third rectifiers having their anode elements connected to said junction point; means for connecting the input signal to one of said elements of said transistor and to the cathode element of said second rectifier; means for connecting the other of said elements of said transistor to the output device; and means for applying a variable control voltage between the anode element of said first rectifier and the cathode element of said third rectifier for changing said switch from on to off and return.

4. In a switch for connecting an input signal to an output device, the combination of: a transistor having a base, a collector element and an emitter element; a negative voltage source; a positive voltage source; a first resistance connected between said base and said negative voltage source; a first rectifier having its cathode element connected to said base; a second resistance connected between said positive voltage source and a junction point; second and third rectifiers having their anode elements connected to said junction point; means for connecting the input signal to one of said elements of said transistor and to the cathode element of said second rectifier; means for connecting the other of said elements of said transistor to the output device; and means for applying a variable control voltage between the anode element of said first rectifier and the cathode element of said third rectifier for changing said switch from on to off and return, the magnitudes of said first resistance and negative voltage source and of said second resistance and positive voltage source being such that the current in said first resistance is substantially equal to the current in said second resistance when said switch is on.

5. In a switch for connecting one of a plurality of input signals to an output device, the combination of: a plurality of input lines; a first common line; a second common line; a first transistor for coupling one of said input lines to said first common line through the transistor collector and emitter; a second transistor for coupling said one input line to said second common line through the transistor collector and emitter; a first control circuit for said first transistor including means for applying a first control voltage to the base thereof; a separate second control circuit for said second transistor, said second control circuit including a rectifier having its cathode element coupled to the associated transistor base, a resistance connected between the rectifier cathode element and a negative voltage source, and means for applying a second control voltage to the anode element of the rectifier; and means for applying the selected input signal to said one input line when each of said control voltages is of a polarity to change said first transistor coupled to said one input line to on and said second transistor coupled to said one input line to off.

6. In a switch for connecting one of a plurality of input signals to an output line, the combination of: a plurality of input lines; a first common line; a second common line; a first transistor for coupling one of said input lines to said first common line through the transistor collector and emitter; a separate control circuit for said first transistor, said control circuit including a pair of rectifiers having their cathode elements connected together and having the anode element of one of said pair connected to the base of said first transistor, a resistance connected between the junction of said rectifier cathode elements and a negative voltage source, and means for applying a control voltage to the anode element of the other of said pair of rectifiers; a second transistor for coupling said second common line to said one input line through the transistor collector and emitter; a third transistor for coupling said second common line to the base of said first transistor through the transistor collector and emitter; a separate control circuit for each of said second and third transistors, each of said control circuits including a rectifier having its cathode element coupled to the associated transistor base, a resistance coupled between the rectifier cathode and a negative voltage source, and means for applying a control voltage to the anode element of the rectifier; and means for applying the selected input signal to said one input line when each of said control voltages is of a polarity to change said first transistor coupled to said one input line to on and said second transistor coupled to said one input line and said third transistor coupled to said first transistor to off.

7. In a switch for connecting one of a plurality of input signals to an output line, the combination of: a plurality of input lines; a first common line; a second common line; a first transistor for coupling one of said input lines to said first common line through the transistor collector and emitter; a separate control circuit for said first transistor, said control circuit including a pair of rectifiers having their cathode elements connected together and having the anode element of one of said pair connected to the first transistor base, a resistance connected between the junction of said rectifier cathode elements and a negative voltage source, and means for applying a control voltage to the anode element of the other of said pair of rectifiers; a separate balance circuit for said first transistor, said balance circuit including a pair of rectifiers having their anode elements connected together and having the cathode element of one of said pair connected to the associated input line, a resistance connected between the junction of said rectifier anode elements and a positive voltage source, and means for applying a control voltage to the cathode element of the other of said pair of rectifiers; a second transistor for coupling said second common line to said one input line through the transistor collector and emitter; a third transistor for coupling said second common line to the base of said first transistor through the transistor collector and emitter; a separate control circuit for each of said second and third transistors, each of said control circuits including a rectifier having its cathode element coupled to the associated transistor base, a resistance coupled between the rectifier cathode and a negative voltage source, and means for applying a control voltage to the anode element of the rectifier; and means for applying the selected input signal to said one input line when each of said control voltages is of a polarity to change said first transistor coupled to said one input line to on and said second transistor coupled to said one input line and said third transistor coupled to said first transistor to off.

8. In a switch for connecting one of a plurality of input signals to an output line, the combination of: a plurality of input lines; a first common line; a second common line; a unity gain amplifier having said first common line as an input and said second common line as an output; a first transistor for coupling one of said input lines to said first common line through the transistor collector and emitter; a separate control circuit for said first transistor, said control circuit including a pair of rectifiers having their cathode elements connected together and having the anode element of one of said pair connected to the base of said first transistor, a resistance connected between the junction of said rectifier cathode elements and a negative voltage source, and means for applying a control voltage to the anode element of the other of said pair of rectifiers; a separate balance circuit for said first transistor, said balance circuit including a pair of rectifiers having their anode elements connected together and having the cathode element of one of said pair connected to the associated input line, a resistance connected between the junction of said rectifier anode elements and a positive voltage source, and means for applying a control voltage to the cathode element of the other of said pair of rectifiers; a second transistor for coupling said common line to said one input line through the transistor collector and emitter; a third transistor for coupling said second common line to the base of said first transistor through the transistor collector and emitter; a separate control circuit for each of said second and third transistors, each of said control circuits including a rectifier having its cathode element coupled to the associated transistor base, a resistance coupled between the rectifier cathode and a negative voltage source, and means for applying a control voltage to the anode element of the rectifier; and means for applying the selected input signal to said one input line when each of said control voltages is of a polarity to change said first transistor coupled to said one input line to on and said second transistor coupled to said one input line and said third transistor coupled to said first transistor to off.

9. A transistor switch comprising a transistor having a base, a collector element and an emitter element; means for connecting a signal source to an output, through said collector and emitter elements; means for turning the switch on and off comprising means for applying a first control voltage, a rectifier connected between the base of said transistor and said control voltage means and poled to permit current conduction from the control voltage to said base, and bias means coupled to said base including a resistance and a potential source poled to forwardly bias the transistor emitter to base junction; and a means for preventing the control current from affecting said signal source comprising a balance circuit which includes a pair of rectifiers having like electrodes connected together and to a potential source, means connecting the other electrode of one of said rectifiers to said signal source, and means connecting the other electrode of the other of said rectifiers to a second control voltage.

References Cited in the file of this patent

UNITED STATES PATENTS

| | | |
|---|---|---|
| 2,816,237 | Hageman | Dec. 10, 1957 |
| 2,823,856 | Booth et al. | Feb. 18, 1958 |
| 2,853,632 | Gray | Sept. 23, 1958 |